United States Patent [19]

Zdebel

[11] Patent Number: 5,026,665
[45] Date of Patent: Jun. 25, 1991

[54] SEMICONDUCTOR DEVICE ELECTRODE METHOD

[75] Inventor: Peter J. Zdebel, Starnberg, Fed. Rep. of Germany

[73] Assignee: Motorola Inc., Schaumburg, Ill.

[21] Appl. No.: 632,564

[22] Filed: Dec. 24, 1990

[51] Int. Cl.⁵ .......................................... H01L 21/283
[52] U.S. Cl. .................... 437/191; 437/203; 437/228; 437/239; 437/162; 437/34
[58] Field of Search .......................... 437/34, 56, 57, 58, 437/74, 191, 193, 195, 203, 228, 239, 985, 162; 148/DIG. 43; 357/65

[56] References Cited

U.S. PATENT DOCUMENTS

| | | | |
|---|---|---|---|
| 4,654,958 | 4/1987 | Baerg et al. | 437/56 |
| 4,659,428 | 4/1987 | Maas et al. | 437/239 |
| 4,845,046 | 7/1989 | Shimbo | 437/228 |
| 4,910,165 | 3/1990 | Lee et al. | 437/239 |

FOREIGN PATENT DOCUMENTS 0213143 9/1987 Japan .................................. 437/985

Primary Examiner—Brian E. Hearn
Assistant Examiner—T. N. Quach
Attorney, Agent, or Firm—Harry A. Wolin

[57] ABSTRACT

A method of fabricating electrodes comprises providing a semiconductor structure having doped tubs and forming a first dielectric layer of a first dielectric material thereon. A second dielectric layer of a second dielectric material is formed on the first dielectric layer and openings are formed in the second dielectric layer that extend to the first dielectric layer. A conformal semiconductor layer is formed over the entire semiconductor structure and nitride spacers are then formed in the openings on the conformal semiconductor layer. The conformal semiconductor layer is then oxidized so that only semiconductor slivers remain beneath the spacers. The spacers and the semiconductor slivers are removed as well as the portions of the first dielectric layer disposed therebeneath. Conductive electrodes which are coupled to the doped tubs are then formed in the openings.

15 Claims, 1 Drawing Sheet

SEMICONDUCTOR DEVICE ELECTRODE METHOD

FIELD OF THE INVENTION

This invention relates, in general, to semiconductor devices, and more particularly to a method of fabricating semiconductor device electrodes.

BACKGROUND OF THE INVENTION

Semiconductor device electrodes are generally coupled to semiconductor device active regions through openings exposing the active regions. As these active regions and devices in general are appreciably scaled, it is necessary that the electrode openings exposing the active regions of the devices and the electrodes themselves are also scaled accordingly. If the openings and electrodes are not scaled down, many real estate and performance advantages obtained by smaller devices will be sacrificed due to large electrode size.

Electrode openings that expose the active regions of a semiconductor device are typically formed by photolithographic processes that are well known in the art. By employing these practical photolithographic processes, it is possible to create openings having widths as small as 0.5 microns through which active regions may be contacted. Additionally, a margin for error must always be allowed as with all photolithographic processes. In order to fabricate openings and electrodes having dimensions smaller than 0.5 microns and less margin for error, technology other than photolithography as is currently practical must be developed.

Accordingly it would be highly desirable to have a method of fabricating semiconductor device electrodes that would create electrodes independent of lithography resolution tolerances and smaller than those attainable using standard photolithographic processes.

SUMMARY OF THE INVENTION

A method of fabricating electrodes comprises providing a semiconductor structure having doped tubs and forming a first dielectric layer of a first dielectric material on the structure and forming a second dielectric layer of the second dielectric material on the first dielectric layer. Openings are formed through the second dielectric layer that extend to the first dielectric layer and a conformal semiconductor layer is then formed on the surface of the structure. Spacers of the first dielectric material are formed on the conformal semiconductor layer in the openings and the conformal semiconductor layer is then oxidized so that only semiconductor slivers remain beneath the spacers. After removing the spacers and the semiconductor slivers, the portions of the first dielectric layer disposed beneath where the semiconductor slivers were formally disposed are removed to expose the doped tubs. Conductive electrodes are then formed in the openings beneath where the semiconductor slivers were formerly disposed.

DETAILED DESCRIPTION OF A PREFERRED EMBODIMENT

Figure 1:
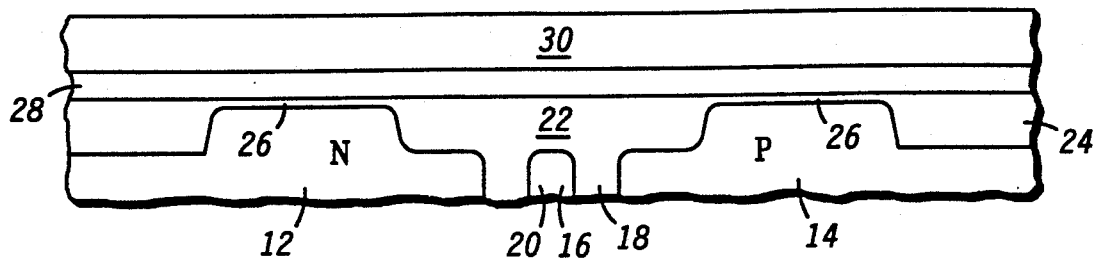
FIGS. 1–4 are highly enlarged cross-sectional views of a semiconductor structure during processing in accordance with the present invention.

FIGS. 1–4 are highly enlarged cross-sectional views of a semiconductor structure 10 during processing in accordance with the present invention. As depicted in FIG. 1, semiconductor structure 1- is a CMOS structure and includes an N-doped tub 12 and a P-doped tub 14. N tub 12 and P tub 14 are isolated from each other by isolation trench 16. Isolation trench 16 includes a dielectric liner 18 and polysilicon trench fill 20. Isolation trench 16 is further capped by dielectric cap 22. N tub 12 and P tub 14 are further isolated by lateral isolation regions 24. As depicted herein, lateral isolation regions 24, dielectric cap 22 and dielectric liner 18 all comprise an oxide although other well known dielectric schemes may be employed. The basic isolation structure depicted herein may be fabricated in accordance with U.S. patent application Ser. No. 07/431,420 entitled "Method of Fabricating Semiconductor Devices having Deep and Shallow Isolation Structures" filed by B. Vasquez and P. Zdebel on Nov. 3, 1989 now U.S. Pat. No. 4,994,406. This application has been allowed and is currently awaiting issue. Doped tubs 12 and 14 may be fabricated in accordance with copending U.S. patent application Ser. No. 07/627,477 entitled "Complementary Semiconductor Region Fabrication" filed by P. Zdebel on Dec. 14, 1990.

Following the formation of the isolation structure and doped tubs 12 and 14 as described above, a screen oxide layer 26 is formed on the surface of N tub 12 and P tub 14. Screen oxide layer 26 has a thickness of approximately 200 angstroms and is formed by thermally oxidizing the top surfaces of N tub 12 and P tub 14. Following the formation of screen oxide layer 26, a nitride layer 28 is formed on semiconductor structure 10. Nitride layer 28 has a preferred thickness on the order of 1000 to 1500 angstroms and may be deposited by methods well known in the art. Once nitride layer 28 has been formed, oxide layer 30 is formed thereon. Oxide layer 30 has a thickness on the order of 3000 to 5000 angstroms and may be formed by many well known methods although PECVD is employed herein.

Figure 2:
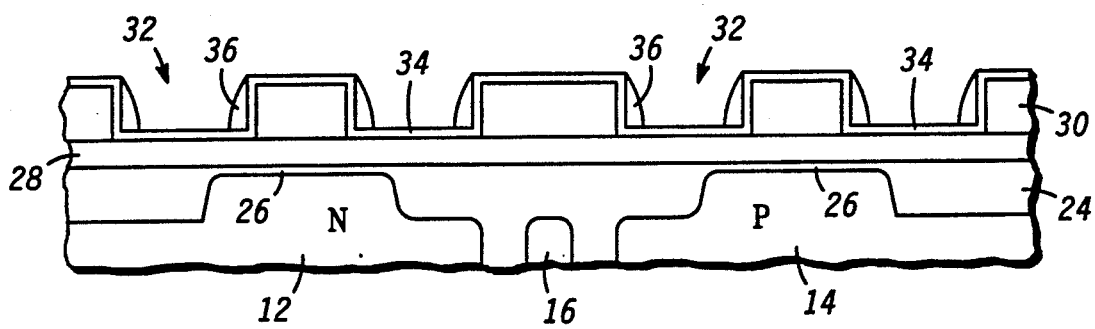

Now referring specifically to FIG. 2 a photomask (not shown) is formed on the surface of oxide layer 30. Oxide layer 30 is then reactive ion etched to form openings 32 that extend completely through oxide layer 30 to nitride layer 28. The RIE chemistry employed for this etch must be selective to oxide so that nitride layer 28 is not etched. Once openings 32 have been formed, a conformal polysilicon layer 34 is formed over the entire surface of semiconductor structure 10 include in openings 32. Conformal polysilicon layer 34 has a thickness on the order of 500 angstroms and is formed by PECVD herein.

After the formation of conformal polysilicon layer 34, a conformal nitride layer (not shown) is formed on conformal polysilicon layer 34. The conformal nitride layer is on the order of 1500 to 3500 angstroms thick and is formed by LPCVD. Following the formation of the conformal nitride layer, nitride spacers 36 are formed on the sidewalls of openings 32. Nitride spacers 36 are formed by reactive ion etching the conformal nitride layer. The RIE chemistry must be selective so that it will etch the conformal nitride layer without damaging conformal polysilicon layer 34. The size of nitride spacers 36 may be varied by altering the thickness of the conformal nitride layer.

Figure 3:
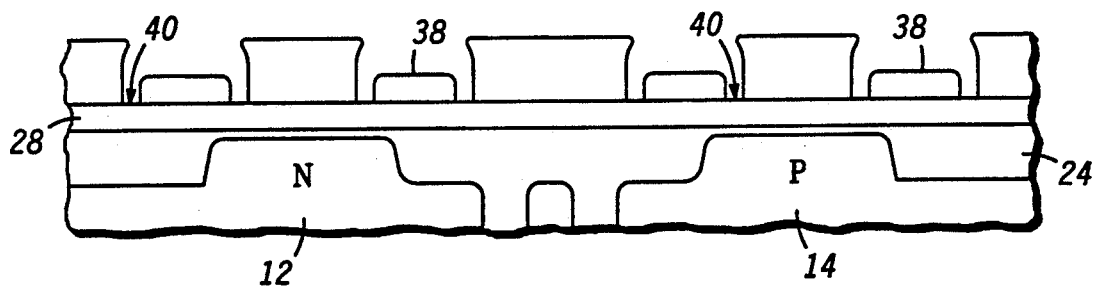

Now referring specifically to FIG. 3. Once nitride spacers 36 have been formed, conformal polysilicon layer 34 is oxidized so that only polysilicon slivers (not shown) remain beneath nitride spacers 36. Hipox oxidation as is well known in the art is employed to oxidize conformal polysilicon layer 34 and yield oxide regions 38. Following the oxidation of conformal polysilicon layer 34, nitride spacers 36 are removed. This may be done by wet etch or selective reactive ion etching. This exposed portions 40 of nitride layer 28.

Figure 4:
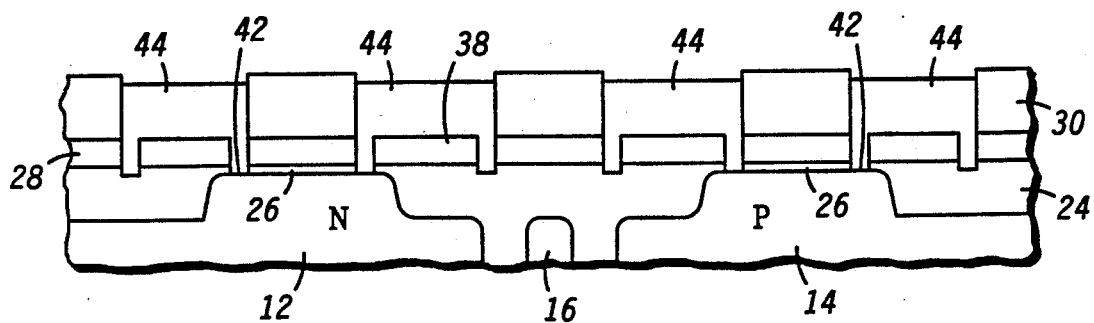

Now referring specifically to FIG. 4. The removal of nitride spacers 36 and the polysilicon slivers allows oxide regions 38 and oxide layer 30 to serve as an etch mask for portions 40 of nitride layer 28. Portions 40 of nitride layer 28 are etched away using an anisotropic reactive ion etch that must be selective to nitride. The portions of screen oxide layer 26 disposed beneath where portions 40 of nitride layer 28 were formerly disposed are also etched away using a reactive ion etch. The etch of these portions of screen oxide layer 26 must be selective to oxide so that the remaining portions of nitride layer 28 are preserved. The etch must also not damage wells 12 and 14 once the portions of screen oxide layer 26 are removed.

Openings 42 formed by removing portions of screen oxide layer 26 and portions 40 of nitride layer 28 are defined by the combined thickness of nitride spacers 36 and conformal polysilicon layer 34. This allows openings 42 to be smaller than those attainable by typical photolithographic methods. Additionally, openings 42 are independent of lithography resolution tolerance. For example, openings 42 may have dimensions as small as 0.1 to 0.5 microns.

Once openings 42 have been formed, polysilicon electrodes 44 are formed. A polysilicon fills openings 32 as well as openings 42 where polysilicon electrodes 44 are actually coupled to doped wells 12 and 14. Because the dimensions of openings 42 are defined by the thickness of nitride spacers 36, the portions of polysilicon electrodes 44 formed in openings 42 that are actually coupled to doped wells 12 and 14 may be extremely small. Once the polysilicon has been deposited, a planarization etch back using reactive ion etching is employed to planarize the polysilicon and specifically form polysilicon electrodes 44.

Polysilicon electrodes 44 are doped according to specific applications. The doping of polysilicon electrodes 44 may be in situ or dopant may be implanted into electrodes 44 following there formation. Doped polysilicon electrodes 44 may be employed to form active regions in doped wells 12 and 14. Dopant may be diffused from electrodes 44 directly into doped regions 12 and 14 to create active regions therein. Because of the very small electrode width where electrodes 44 are coupled to doped regions 12 and 14 the active regions formed by diffusing dopant may be scaled so that their width is extremely small and independent of lithography resolution tolerance. This enables extremely scaled devices utilizing less real estate, having less parasitic capacitance hence high speed performance and greatly improved low power performance.

Thus it is apparent that there has been provided, in accordance with the invention, an improved semiconductor device electrode method. While specific embodiments of the invention have been shown and described, further modifications and improvements will occur to those skilled in the art. It is desired that it be understood, therefore, that this invention is not limited to the particular forms shown and it is intended in the appended claims to cover all modifications which do not depart from the spirit and scope of this invention.

What is claimed is:

1. A method of fabricating electrodes comprising the steps of:
   providing a semiconductor structure having doped tube;
   forming a first dielectric layer of a first dielectric material on said structure;
   forming a second dielectric layer of a second dielectric material on said first dielectric layer;
   forming openings in said second dielectric layer that extend to said first dielectric layer;
   forming a semiconductor layer in said openings;
   forming spacers of said first dielectric material in said openings on said semiconductor layer;
   oxidizing said semiconductor layer so that only semiconductor slivers remain beneath said spacers;
   removing said spacers;
   removing said semiconductor slivers;
   removing the portions of said first dielectric layer beneath where said semiconductor slivers were formerly disposed; and
   forming conductive electrodes coupled to said doped tubs in said openings.

2. The method of claim 1 wherein the first dielectric material comprises a nitride and the second dielectric material comprises an oxide.

3. The method of claim 1 wherein the conductive electrodes comprise doped polysilicon.

4. The method of claim 3 wherein dopant is diffused from the doped polysilicon electrodes into the doped tubs of the semiconductor structure.

5. The method of claim 1 wherein the electrode width where the electrode is coupled to the doped tubs is defined by the combined thickness of the spacers and the semiconductor layer.

6. A method of fabricating electrodes comprising the steps of:
   providing a semiconductor structure having doped tubs;
   forming a nitride layer on the surface of said structure;
   forming an oxide layer on said nitride layer;
   patterning and etching said oxide layer to form openings therein, said openings extending to said nitride layer;
   depositing a polysilicon layer in said openings;
   forming nitride spacers abutting said polysilicon layer on the sidewalls of said openings;
   oxidizing said conformal polysilicon layer so that only polysilicon slivers remain beneath said nitride spacers;
   removing said nitride spacers;
   removing said polysilicon slivers;
   removing the portions of said nitride layer disposed beneath where said nitride spacers and said polysilicon slivers were formerly disposed; and
   forming polysilicon electrodes in said openings, said electrodes being coupled to said doped tubs through the openings formed by removing said portions of said nitride layer.

7. The method of claim 6 wherein a screen oxide layer is formed on said doped tubs prior to the forming a nitride layer step and portions of the screen oxide layer are removed following the removing the portions of said nitride layer step.

8. The method of claim 6 wherein the polysilicon electrodes are doped.

9. The method of claim 8 wherein dopant is diffused from the polysilicon electrodes into the doped tubs of the semiconductor structure.

10. The method of claim 6 wherein the electrode width where the electrode is coupled to the doped tubs is defined by the combined thickness of the nitride spacers and the polysilicon layer.

11. A method of forming active regions in a semiconductor structure comprising the steps of:

providing a semiconductor structure having at least one doped tub;

forming a nitride layer on the surface of said structure;

forming a nitride layer on said nitride layer;

forming at least one opening through said oxide layer extending to said nitride layer wherein at least one sidewall of said opening is aligned above said at least one doped tub;

forming a polysilicon layer in said at least one opening;

forming nitride spacers abutting said polysilicon layer on the sidewalls of said at least one opening;

oxidizing said polysilicon layer so that only polysilicon slivers remain beneath said nitride spacers;

removing said nitride spacers;

removing said polysilicon slivers;

removing the portions of said nitride layer disposed beneath where said nitride spacers and said polysilicon slivers were formerly disposed;

forming a doped polysilicon electrode in said at least one opening wherein said electrode is coupled to said at least one doped tub through the opening formed by removing said portion of said nitride layer disposed above said tube; and diffusing dopant from said electrode into said at least one doped tub to form an active region therein.

12. The method of claim 11 wherein a screen oxide layer is formed on said at least one doped tub prior to the forming a nitride layer step and portions of said screen oxide layer are removed following the removing the portions of said nitride layer step.

13. The method of claim 11 wherein the polysilicon electrode is doped in situ or by implantation.

14. The method of claim 11 wherein the electrode width where the electrode is coupled to the at least one doped tub is defined by the combined thickness of the nitride spacers and the polysilicon layer.

15. The method of claim 14 wherein width of the diffused active region is dependent upon the electrode width where the electrode is coupled to the at least one doped tub.

* * * * *